Oct. 28, 1969 V. S. BISHOP ETAL 3,475,097

MASK ALIGNMENT TOOL

Filed April 11, 1966

INVENTOR.
Virgil S. Bishop
Hart Shekerjian

BY Mueller, Aichele & Rauner

ATTY'S 3,475,097

MASK ALIGNMENT TOOL

Virgil S. Bishop, Phoenix, and Hart Shekerjian, Scottsdale, Ariz., assignors to Motorola, Inc., Franklin Park, Ill., a corporation of Illinois Filed Apr. 11, 1966, Ser. No. 541,756
Int. Cl. G03b *27/20, 27/02*
U.S. Cl. 355—91 10 Claims

ABSTRACT OF THE DISCLOSURE

A mask alignment tool in which the mask to be aligned is movable in infinitely small steps perpendicular to the planes of the mask and the object aligned therewith to bring the mask into contact with the object. The tool includes a centrally positioned vacuum chuck for supporting a wafer, a vertically adjustable flanged member for surrounding the point of the wafer support, and a flexible support element for maintaining the mask at a short distance from the wafer during alignment thereof. The tool has an annular chamber projecting upwardly into the chuck member through which a vacuum may be selectively applied to the space between the wafer and the mask formed by the flexible member. After the mask and wafer have been properly aligned, a vacuum is applied to the space between the mask and the wafer to bring them into intimate contact with each other and an exposure is made.

Figure 1:
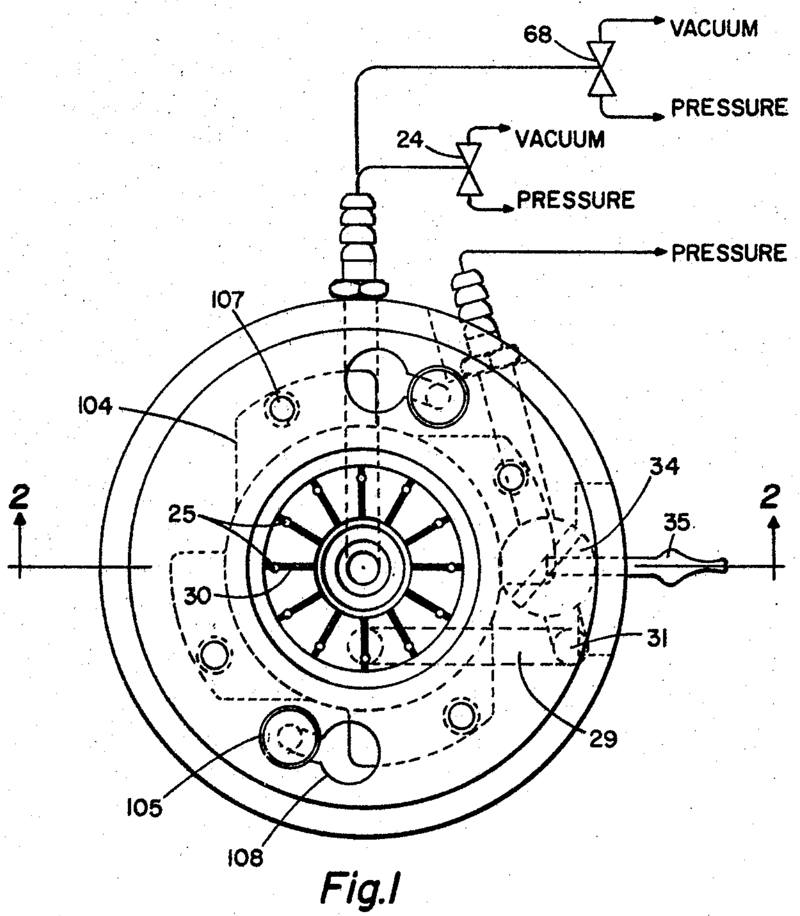

This invention relates to mask alignment and more particularly to a mask alignment tool for use in the manufacturing of semiconductor devices and a method of aligning the very small areas associated therewith.

In the fabrication of semiconductor devices, it is common practice to use photosensitive etch resistant materials, masks, and etchants to define areas involved in various processing steps. When, as is often the situation, more than one pattern must be utilized in a series of steps, it is necessary that the latter patterns be registered with the initial pattern on the wafter. In semiconductor processing, very precise alignment is required because of the small dimensions involved and the probability that misalignment will result in non-functioning devices.

Apparatus previously used for this aligning operation included combinations of micrometer type adjusters to vary the position of a mask being aligned relative to a wafer. With this type of apparatus, it was usually possible only to make adjustments in two directions at one time. As a result, after alignment of the X and Y axes a slight change in the theta (rotational) direction resulted in a misalignment again of the X and Y axes. This required an alternating trial and error operation of aligning the X and Y axes and then theta to obtain a preliminary alignment. When the preliminary alignment was obtained, the mask was brought in contact with the wafer by some mechanical action before exposure of the emulsion on the wafer. This was often accomplished by the rotation of a cam that raised or lowered a supporting surface for either the mask or wafer. This mechanical movement was found to produce additional misalignment, and as a result, operators generally made allowances for this alteration when they were making their preliminary alignment before the contacting. This alteration caused guesswork alignment which was and still is undesirable in production operations.

When contact was made between the mask and the wafer, there were often areas in very good intimate contact, some areas out of focus because of lack of contact and other areas damaged because the pressure was too great. After contact was achieved, the mask and wafer were moved generally on a slide, under a light for exposure while the micrometer adjusters and mounting tables were held relatively immobile. Therefore, during the period of exposure and alignment tool could not be used.

An object of this invention is to provide a mask alignment tool in which the mask to be aligned is movable in infinitely small steps perpendicular to the planes of the mask and wafer, such that final movement securing the position of the mask relative to the wafer retains the alignment observed by the operator.

Another object of the invention is to provide a mask alignment tool for aligning a mask and a wafer wherein a controllable X, Y, Z and theta change in position may be made simultaneously of the mask relative to the wafer.

A further object of the invention is to provide a mask alignment tool in which the pressure urging the mask and the wafer into intimate contact is variable in very small increments yet may be controlled such that a selected pressure may be reproducibly obtained for a plurality of contacts in succession.

A still further object of the invention is to provide a mask alignment tool that may be fabricated with a capability of a higher production rate and higher productive time utilization of the equipment than previously used tools.

Another object of this invention is to provide a novel method for rapidly aligning a mask and a wafer by simple hand operations, in which the operator's hands directly control the movement of one article relative to the other article in all four directions, X, Y, Z and theta.

A feature of this invention is the provision of a mask alignment tool including a movable member forming an airtight seal with a mask placed thereon to form a variable size chamber in which the distance between the mask placed thereon over a wafer is readily altered in a direction perpendicular to the planes of the mask and the wafer.

Another feature of the invention is the provision of a mask alignment tool in which the facility of movement of a mask relative to a wafer is regulated by air pressure applied to an airtight chamber of which the mask and a movable member of the alignment tool form a part.

A further feature of the invention is the provision of a method for aligning articles utilizing the mask alignment tool of the invention wherein the alignment movements are directly controlled for all directions, X, Y, Z and theta, by the hands of the operator of the tool.

Figure 2:
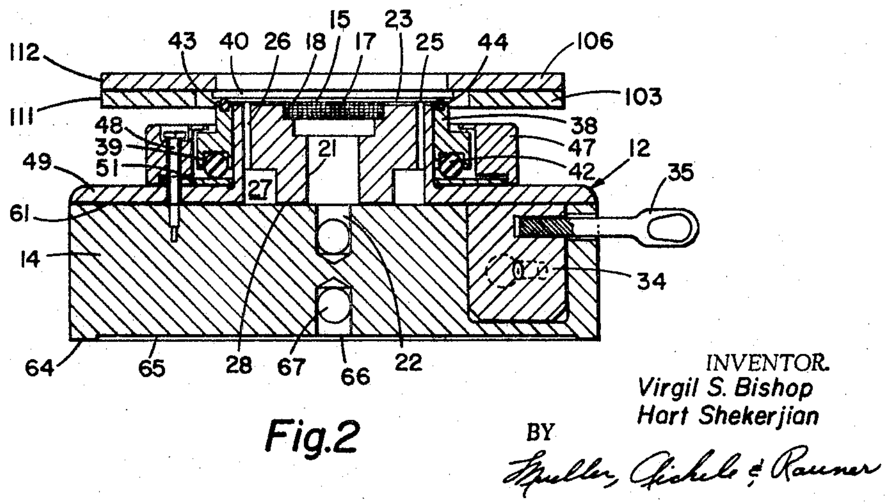

In the accompanying drawing:

FIG. 1 is a plan view of a mask alignment tool embodied in the invention with a mask and mask holder thereon; and FIG. 2 is a sectional view along line 2—2 of FIG. 1.

The invention is embodied in a mask alignment tool for positioning a mask relative to a wafer including a body having a face with a first portion for supporting a wafer. This first portion has at least one opening therein communicating with a first passage extending through the body connectable to a first source of variable pressure. A second portion on the face surounds the first portion and has at least one opening therein that is exposed when a wafer is positioned on the first portion. This opening in the second portion communicates with a second passage extending through the body that is connectable to a second source of variable pressure. Movable means for supporting the mask surrounds the first and second portions. This means, with the mask thereon, may be varied between a normal resting position with the mask adjacent to but spaced from the wafer and a position in which the mask is in intimate contact with the wafer. The means, mask and surrounded portions form a substantially airtight chamber.

The invention is also embodied in a method of aligning a mask relative to a wafer which includes the positioning of the wafer on a first portion and applying a vacuum to the wafer to retain it in position. A mask is placed over the wafer and maintained in a spaced relationship to the wafer. The mask is then aligned relative to the wafer by adjusting the position of the mask while adjusting the amount of vacuum applied thereto. After alignment has been obtained, the mask is retained in the desired position by application of a suitable vacuum.

A mask alignment tool embodying the invention, as shown in FIGS. 1 and 2 of the drawing, has a flanged cylindrical vacuum chuck 12 secured to a cylindrical base 14. The top face of vacuum chuck 12 has a first portion 15 for supporting a semiconductor wafer and a surrounding second portion 23. First portion 15 includes the top surface of a cylindrical porous bronze air filter 17 inserted in a cylindrical recess 18 in chuck 12. The shape and size of the wafer supporting area is selected to correspond to the configuration of the semiconductor wafers with which this alignment tool is used. Filter 17 is connected to a source of variable pressure by a passage 21 extending through chuck 12 that connects to a passage 22 in base 14. The pressure is regulated by a valve 24 that is provided with a foot control (not shown) to free the hands of the operator of the tool for other functions. Second portion 23 includes twelve openings 25. These twelve openings connect to corresponding passages 26 extending through chuck 12 to an annular chamber 27 projecting upwardly into the chuck 12 from a bottom face 28 thereof. A groove 29 is fabricated in base 14 to connect annular chamber 27 with a passage 31 that connects with a source of variable pressure through a control valve 34 that is preferably located in the body of base 14. In order that control valve 34 may be easily manipulated by the operator while performing other operations, it is provided with a short handle 35 extending slightly beyond the periphery of base 14. Openings 25 are also each connected by bleeder grooves 30 to filter 17 for controlling the pressure exerted on the mask to be aligned with the wafer.

A movable member 38, adjustable in a direction perpendicular to the plane of the wafer, is fabricated to form a very tight fit with the cylindrical body of chuck 12 when positioned thereabout and to surround portion 15 and portion 23. Movable member 38 has a flanged portion closer to base 14 including a groove 39 retaining therein a large flexible O ring 42. The portion of the member 38 adjacent to the mask 40 has a tapered groove 43 that is narrower at the open end retaining therein a smaller flexible O ring 44. In the normal rest position, a portion of O ring 44 extends above the top face of chuck 12. As movable member 38 is urged downwardly, flexible O rings 42 and 44 deform to such an extent that the top of O ring 44 may be depressed to a position level with the top face of chuck 12. A collar 47 is joined to base 14 by bolts 48, also engaging flange 49 on chuck 12 to maintain member 38 and chuck 12 in position. Proper positioning of the top of O ring 44 is obtained by the use of thin shims 51.

The mask is mounted between circular members 103 and 106. Bottom member 103 includes four cut outs 104 for receiving the corners of the mask and two thumb screws 105. Top member 106 has four plastic buttons 107 that seat in cut outs 104 to press against the mask resting therein. Two key slots 108 fit over thumb screws 105 and aid in the correct alignment of members 103 and 106. Edge 111 of bottom member 103 and edge 112 of top member 106 are knurled to facilitate the gripping of them by an operator.

Chuck 12 is supported on a face 61 of base 14 which face also includes groove 29 and the opening for passage 22. Base 14 rests on an annular ring 64 that surrounds a recess 65. An opening 66 connected to passage 67 is included in recess 65 and joins the same with a source of variable pressure through a control valve 68. This valve is generally controlled by a foot switch (not shown) to free the hands of the operator for other functions. To reduce sliding friction, ring 64 may be covered with a fine felt (not shown) having an adhesive backing. If material of this nature is utilized, it must be carefully selected so that a substantially airtight seal may be formed with the surface supporting the tool.

In the alignment of a mask 40 with a wafer (not shown) having a pattern on a surface thereof, the wafer is placed on the first portion 15 on the top face of chuck 12 and vacuum applied thereto to hold the wafer in position. The amount of vacuum is regulated by valve 24 which is advantageously operated by a foot control (not shown). Mask 40, mounted between circular members 103 and 106, is placed on O ring 44 of movable member 38 so that the mask may be positioned relative to the wafer. Movable member 38 retains two O rings 44 and 42, herein composed of silicone rubber, that are resistant to excessive wear yet resilient enough to allow the desired movement of the mask and the formation of an airtight seal therewith.

The operator positions the alignment tool so that the mask and wafer may be observed through a microscope (not shown) and locks the tool in place by applying a vacuum to the chamber formed by annular ring 64, recess 65 and the table top on which the tool rests. When the tool is to be moved, a positive pressure is applied to this chamber to impart a floating action thereto because of the resulting air cushion. Both the vacuum and positive pressure are regulated by valve 68 which is controlled by a foot actuated switch (not shown) so that the operator's hands are free for other functions. With the alignment tool under the microscope and held stationary on the table by the vacuum, the operator aligns the mask while reducing the air pressure applied thereto through openings 25 surrounding first portion 15 by adjusting valve handle 35 on the side of the alignment tool. As this pressure is reduced, bleeder grooves 30 extending from filter 17 to openings 25 cause the bleeding or decreasing of the pressure in the chamber defined by mask 40, movable member 38, first portion 15 and second portion 23.

Atmospheric pressure forces mask 40 down on O ring 44 forming a tighter seal therewith and increasing the frictional forces therebetween resistant to movement of mask 40 in a plane parallel to the wafer. As the frictional forces increase, the mechanical advantage aiding alignment appears to increase in that finer and finer adjustments may be obtained. At the same time, that is, as the pressure in the chamber is decreased, the distance between mask 40 and the wafer is reduced giving clearer definition and more accurate alignment capabilities. When alignment is obtained, the air to openings 25 is shut off and mask 40 held immobile by the atmospheric pressure bearing thereon (the chamber being at subatmospheric pressure as a result of bleeder grooves 30).

With the initial alignment obtained, the operator releases the vacuum on the bottom chamber of the tool and applies air pressure. The tool is moved so that another area of mask 40 and the wafer is observed and the alignment steps repeated, if necessary. This procedure is repeated until a final alignment is obtained over the whole wafer that is satisfactory. The use of atmospheric pressure to lock mask 40 in position is advantageous in that mask 40 is moved perpendicular to the planes of mask 40 and the wafer and also presses uniformly thereon with a consistent and repeating force.

When the tool is used for aligning mask 40 with a fragment of a wafer, a positive pressure through openings 25 is required to maintain the freedom of movement required for alignment. With a fragment of a wafer, the increased vacuum resulting from uncovered portions of air filter 17 has a greater tendency to lock mask 40 in place.

With mask 40 locked in place by the vacuum in the chamber, the alignment tool is moved under a suitable exposure light where the emulsion on the wafer is exposed. The quality of the exposure is believed to be improved because of the vacuum in the chamber. The removal of the air barrier normally existing between a mask and wafer also removes the oxygen normally present which is thought to be detrimental to good exposure technique. Additionally, with this tool an inert atmosphere may be maintained between the mask and wafer.

While an exposure is being performed, it has been found advantageous for the operator to align a mask and wafer on another alignment tool. The mobility of the tool and its relative low cost, about one-third that of equipment heretofore used, make this procedure very attractive. Additionally, the use of the tandem or dual alignment tools has been found to increase the number of exposures from between about 40 and 50 per hour to about 90 per hour, representing nearly 100% increase in productivity.

Although the mask alignment tool of the invention may be fabricated from a single body of material, it is preferably a two-piece assembly comprised of a vacuum chuck supported by a base. The use of two pieces in the assembly offers greater flexibility in the selection of materials for particular properties such as weight, durability, etc. Also, the complexity of machining is significantly reduced with a two-piece assembly that offers easy access for the formation of lateral grooves. A cylindrical shape is advantageous for the tool because of the X, Y and theta adjustments that are performed substantially simultaneously. Other shapes may be utilized and be more convenient in specific operations.

The surface supporting the article that remains stationary during the alignment is constructed in accordance with the physical properties of the article. For fragile articles subject to breakage, it is advantageous to have this surface include more than one hole to which the vacuum is applied. Porous bronze air filters provide good even support and do not damage the article or impede the effective vacuum applied thereto.

The physical properties of the movable member should be similar to those of the portion of the mask alignment tool surrounded thereby. The movable member co-acting with the mask, or holder thereof, and a portion of the mask alignment tool forms a chamber that is variable in size. This member should be machined so that it does not bind on the tool yet fits snugly enough with the chuck and mask that a substantially airtight chamber is formed thereby. Preferably, the movable member will be comprised of a finely machined sleeve portion capable of retaining resilient members at each face that respectively contact the article that is to be positioned and a portion of the chuck. O rings are particularly useful in that they may be retained in channels formed in the sleeve with enough room for deformation permitting up and down motion of the movable member, while still forming an effective airtight seal as mentioned above. Silicone rubbers or similar resilient materials also produce a desirable sliding friction with the article being positioned as increased pressure is applied thereto.

The mask alignment tool of the invention is preferably utilized with masks and wafers associated with the fabrication of semiconductor devices. The masks usually consist of an array of identical patterns spaced on centers consistent with the size of the devices being fabricated. The wafer is subjected to different masks, arranged in a progressive series, at various steps in the fabrication of the semiconductor device. The tool is also advantageous for the first masking step in the fabrication.

The above description, drawing and example show that the present invention provides a novel structure for a mask alignment tool and method for aligning very small areas. Furthermore, the mask alignment tool of the invention provides the capability of moving the mask in very small steps perpendicular to the planes of the mask and wafer such that the final movement, fixing the mask in place, retains the alignment observed by the operator. Moreover, with the mask alignment tool, substantially simultaneous movements of the mask can be made in the X, Y, Z and theta directions. The mask alignment tool of the invention permits reproducible control of the pressure urging the mask and wafer together. This tool is less expensive than prior art tools, yet yields a higher production rate and more efficient use of equipment and operator time. Additionally, a novel method is provided for aligning a mask and wafer utilizing the mask alignment tool of the invention.

We claim:

1. A mask alignment tool for positioning a mask relative to a wafer, said tool including a body having a face with a first portion for supporting a wafer, said first portion having at least one opening communicating with a first passage through said body connectable to a first source of variable pressure, a second portion on said face surrounding said first portion said second portion having at least one opening that is exposed when a wafer is positioned on said first portion, said opening communicating with a second passage through said tool connectable to a second source of variable pressure, and movable means for supporting a mask surrounding said first and second portions, said means being movable between a normal resting position wherein a mask placed thereon is adjacent to but spaced from a wafer on said first portion and a position wherein a mask placed thereon is in intimate contact with a wafer on said first portion, said means capable of forming a substantially airtight seal when a mask is placed thereon.

2. A mask alignment tool according to claim 1 having means for varying the pressure in said second opening at said second portion.

3. A mask alignment tool according to claim 1 having means for varying the pressure in said first opening at said first portion.

4. A mask alignment tool according to claim 1 having on a second face a surface for supporting said tool completely surrounding a recess in said second face, said recess including at least one opening communicating with a passage extending through said body connectable to a source of variable pressure.

5. A mask alignment tool according to claim 4 having means for varying the pressure applied at said recess.

6. Apparatus for the precise alignment of a mask pattern with respect to a substrate pattern which comprises in combination:

(a) means for holding the substrate in a fixed position;
(b) flexible support means for maintaining the mask a short distance from the substrate;
(c) means for permitting an operator to move the mask relative to the substrate to achieve the desired alignment; and
(d) means for reducing the pressure between the mask and the substrate, whereby the mask and substrate are forced together in intimate contact, while preserving the precise alignment achievable prior to actuation of said means for reducing the pressure between mask and substrate.

7. A method for the precise alignment of a mask pattern with respect to a substrate pattern which comprises:

(a) holding the substrate in a fixed position by the application of a reduced pressure to a surface thereof;
(b) placing the mask near the substrate pattern and maintaining a short distance between the mask and the substrate by means of a flexible support;
(c) moving the mask relative to the substrate to achieve the desired alignment; and
(d) reducing the pressure between the mask and the substrate until the mask and substrate are forced together in intimate contact while preserving the precise alignment achieved in step (c).

8. A method according to claim 7 including the step of exposing said substrate to light through said mask.

9. A method according to claim 7 including applying positive pressure to said mask to maintain it spaced from said substrate.

10. A method according to claim 7 including filling the space between said mask and substrate with an inert gas.

References Cited

UNITED STATES PATENTS

| | | | |
|---|---|---|---|
| 2,680,994 | 6/1954 | Wood | 269—21 |
| 2,730,370 | 1/1956 | Brewster | 279—3 |

| | | | |
|---|---|---|---|
| 3,006,245 | 10/1961 | Bycer et al. | 33—180 |
| 3,192,844 | 7/1965 | Szasz et al. | 95—76 XR |
| 3,220,331 | 11/1965 | Evans et al. | 95—76 XR |

NORTON ANSHER, Primary Examiner

FRED L. BRAUN, Assistant Examiner

U.S. Cl. X.R.

29—578; 269—21; 355—132